US008650527B2

(12) United States Patent
Oliva et al.

(10) Patent No.: US 8,650,527 B2
(45) Date of Patent: Feb. 11, 2014

(54) METHOD AND SOFTWARE TOOL FOR ANALYZING AND REDUCING THE FAILURE RATE OF AN INTEGRATED CIRCUIT

(71) Applicant: Apple Inc., Cupertino, CA (US)

(72) Inventors: Antonietta Oliva, San Jose, CA (US);
Gregory S Scott, Santa Clara, CA (US);
Edgardo F Klass, Palo Alto, CA (US);
Vincent R von Kaenel, Neuchatel (CH)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/663,755

(22) Filed: Oct. 30, 2012

(65) Prior Publication Data

US 2013/0055191 A1 Feb. 28, 2013

Related U.S. Application Data

(62) Division of application No. 13/177,916, filed on Jul. 7, 2011, now Pat. No. 8,327,310.

(51) Int. Cl.
*G06F 17/50* (2006.01)
*G06F 11/22* (2006.01)
*G06F 9/455* (2006.01)

(52) U.S. Cl.
USPC .......................................... 716/136; 716/133

(58) Field of Classification Search
USPC ................................................. 716/133, 136
See application file for complete search history.

(56) References Cited

U.S. PATENT DOCUMENTS

| 6,766,274 | B2 | 7/2004 | Puthucode | |
|---|---|---|---|---|
| 7,155,359 | B1* | 12/2006 | Kim et al. | 702/117 |
| 7,340,360 | B1 | 3/2008 | Zhang | |
| 8,099,269 | B2 | 1/2012 | Topaloglu et al. | |
| 8,397,199 | B2 | 3/2013 | Soni et al. | |
| 2007/0143718 | A1* | 6/2007 | Abercrombie et al. | 716/4 |
| 2008/0276206 | A1* | 11/2008 | Mariani | 716/4 |
| 2009/0094569 | A1 | 4/2009 | Kuchii | |
| 2010/0088660 | A1 | 4/2010 | Kim | |
| 2010/0114543 | A1 | 5/2010 | Namba | |
| 2011/0022894 | A1* | 1/2011 | Fantana et al. | 714/37 |
| 2011/0257954 | A1 | 10/2011 | Soni | |
| 2012/0072789 | A1* | 3/2012 | Chen et al. | 714/718 |

OTHER PUBLICATIONS pp. 1-2 entitled "Background of the Invention" from the specification of the application publication No. 2011-0257954.
Keith Green, "Simulation of Circuit Reliability with RelXpert," Texas Instruments and Cadence, Sep. 22, 2005, 19 pages.

(Continued)

*Primary Examiner* — Suresh Memula
(74) *Attorney, Agent, or Firm* — Lawrence J. Merkel; Meyertons, Hood, Kivlin, Kowert & Goetzel, P.C.

(57) ABSTRACT

A software tool and method for analyzing the reliability or failure rate of an integrated circuit (IC) are disclosed. The IC may include a plurality of circuit designs, and the software tool and method may aid a designer of the IC in determining a reliability rating of the IC based on reliability ratings of transistors or other circuit devices used in the circuit designs. In particular, the IC may include one or more circuit designs that have multiple instances within the IC (i.e., the same circuit design is instantiated multiple times), and the software tool and method may take into account the multiple instances when determining the reliability rating of the IC.

20 Claims, 7 Drawing Sheets

(56) References Cited

OTHER PUBLICATIONS

RelXpert, "The Solution for Circuit-Level, Hot-Carrier / NBTI Simulation," Celestry Design Technologies, 8 pages. Downloaded from Internet before Feb. 5, 2010.

Cadence, "Reliability Simulation in Integrated Circuit Design," White Paper, 2003, 11 pages.

Liu et al.; "Design Tools for Reliability Analysis"; Jul. 24, 2006; ACM; pp. 1-6.

Srinivasan et al.; "Lifetime Reliability: Toward an Architectural Solution"; 2005; IEEE; pp. 1-11.

\* cited by examiner

METHOD AND SOFTWARE TOOL FOR ANALYZING AND REDUCING THE FAILURE RATE OF AN INTEGRATED CIRCUIT

This application is a divisional application of U.S. patent application Ser. No. 13/177,916, filed Jul. 7, 2011 and now U.S. Pat. No. 8,327,310. The application is incorporated herein by reference in its entirety.

BACKGROUND

1. Field of the Invention

This application is related to the field of integrated circuit design, and more particularly to a software tool and method for analyzing the failure rate of an integrated circuit.

2. Description of the Related Art

Transistor devices in a circuit can undergo gate oxide degradation as a consequence of excessive voltage across the oxide during voltage overshoot and undershoot events. This degradation can cause excessive leakage in the device or even catastrophic damage of the gate oxide, causing circuit malfunction. This damage can manifest as a failure in the field of a product containing the circuit. Thus, as part of the product design flow, it is important to identify circuit devices which are susceptible to gate oxide breakdown caused by over-voltage during normal operating conditions. This is particularly important for products having circuits containing devices whose voltage rating is less than the voltage produced on I/O pins coupled to the circuits.

Various commercially-available simulation software tools can be used to simulate the operation of a circuit in order to identify the voltage and other operating conditions experienced by the circuit devices (e.g. transistors) during operation of the circuit. The operating conditions can then be used to compute a reliability rating or failure rate for each device. For example, the foundry which produces a device may provide a mathematical equation which takes into account variables such as the maximum voltage across the device, the time for which the maximum voltage was sustained, the temperature conditions in which the device is operating, the total time of operation, etc. Evaluating the equation computes a predicted failure rate for the device in the circuit based on these variables. Thus, the failure rate for an individual device in a circuit under given conditions can be determined fairly accurately (to the extent that the simulation and device equations are accurate).

This may help a circuit designer to determine the expected reliability of an individual circuit. However, the reliability of an individual circuit may not provide an accurate measure of how the circuit affects the reliability of a product in which the circuit is used. For example, many products use integrated circuits that can contain multiple instances of the same circuit. Thus, even if the predicted failure rate of each individual instance of the circuit is low, the possibility that one of the instances of the circuit can fail during normal operation may result in an unacceptably high failure rate for the overall product.

SUMMARY

Various embodiments of a software tool and method for analyzing the reliability or failure rate of an integrated circuit (IC) are described herein. The IC may include a plurality of circuit designs. The software tool and method may aid a designer of the IC in determining a reliability rating of the IC based on reliability ratings of transistors or other circuit devices used in the circuit designs. In particular, the IC may include one or more circuit designs that have multiple instances within the IC (i.e., the same circuit design is instantiated multiple times), and the software tool and method may take into account the multiple instances when determining the reliability rating of the IC.

According to one embodiment of the method, input may be received on a computer system indicating results of simulating one or more circuit designs used in the IC. The one or more circuit designs may be susceptible to over-voltage conditions during operation of the integrated circuit. The method may operate to analyze the simulation results on the computer system to determine that voltages on one or more circuit devices used in the one or more circuit designs exceed a maximum allowable voltage during the simulation. A respective scaled reliability rating for each of the circuit devices affected by the excessive voltages may be computed, where the scaled reliability rating for a given circuit device is dependent on a number of instances in the IC of the corresponding circuit design in which the given circuit device is used. The method may further comprise displaying on a display device of the computer system an indication of reliability of the IC, where the indication of reliability is based on the scaled reliability ratings for each of the circuit devices affected by the excessive voltages.

Further embodiments of the method may include computing on the computer system a respective individual reliability rating for each of the circuit devices affected by the excessive voltages, where the individual reliability rating for a given circuit device indicates an expected reliability of a single instance of the given circuit device in a single instance of the respective circuit design in which the given circuit device is used. The scaled reliability rating for each respective circuit device may be dependent on the respective individual reliability rating for the respective circuit device as well as on the number of instances in the IC of the corresponding circuit design in which the respective circuit device is used.

In some embodiments the scaled reliability ratings for the circuit devices may be used to compute an overall reliability rating for the IC. Input specifying a permissible reliability tolerance for the IC may be received. In some embodiments the indication of reliability of the IC may indicate whether the overall reliability rating for the IC is within the permissible reliability tolerance. Further embodiments of the method may include displaying the scaled reliability ratings for at least a subset of the circuit devices affected by the excessive voltages. The scaled reliability ratings may be displayed in a ranked order that indicates which circuit device has the lowest scaled reliability rating.

BRIEF DESCRIPTION OF THE DRAWINGS

The following detailed description makes reference to the accompanying drawings, which are now briefly described.

Figure 1:
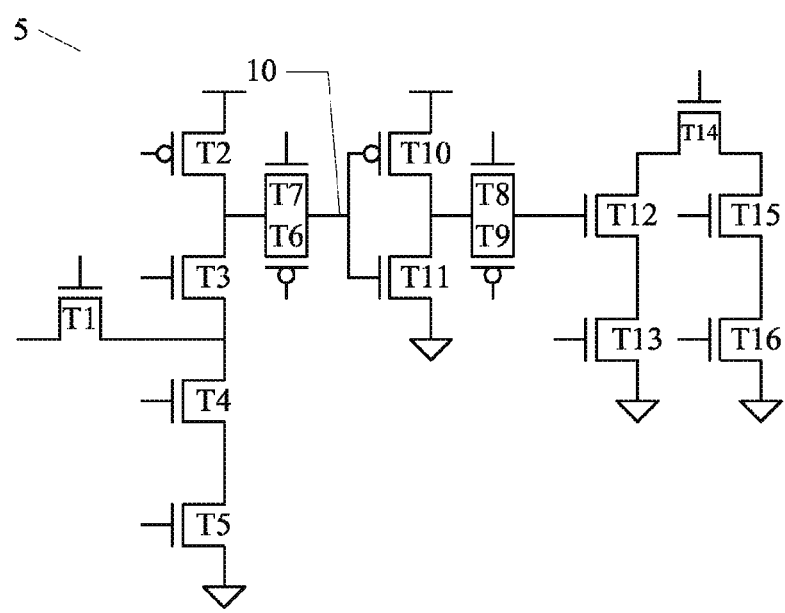
FIG. 1 is a circuit diagram illustrating an example of a circuit that may be included in an integrated circuit (IC)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Various embodiments of a software tool and method for analyzing the reliability or failure rate of an integrated circuit (IC) are described herein. In some embodiments the IC may be referred to as a system-on-a-chip (SoC). The IC or SoC may be used in any type of system or product. For example, in some embodiments the IC may be used in a mobile phone or other handheld electronic device.

The IC may include a plurality of circuits, which may be analog, digital, or mixed-signal circuits, or some combination of these. The software tool and method described herein may aid a designer of the IC in determining a reliability rating of the IC based on the reliability ratings of the circuits within the IC. In particular, the IC may include one or more circuits that have multiple instances within the IC (i.e., the same circuit design is instantiated multiple times), and the software tool and method may take into account the multiple instances when determining the reliability rating of the IC, as described in detail below.

FIG. 1 is a circuit diagram illustrating an example of a circuit 5 that may be included in the IC according to one embodiment. The circuit may include various transistor devices, such as the transistors T1-T16. Additional transistors may be included as desired. Additional circuit devices may also be included, e.g. capacitors (which are sometimes implemented via transistors also), resistors, etc. In various embodiments a circuit in the IC may perform any function, and FIG. 1 merely illustrates an example of a circuit which includes transistor devices that are susceptible to gate oxide degradation resulting from excessive voltage across the transistors during operation of the circuit. The transistors T1-T16 may be of various types, such as P-type metal-oxide-semiconductor (PMOS) transistors or N-type MOS (NMOS) transistors. The PMOS transistors are illustrated with the circle on the gate terminal, and the NMOS transistors do not include the circle (i.e., standard symbols for PMOS and NMOS transistors, respectively). Other embodiments may include other MOS transistors, other field effect transistors, and/or other transistor types (e.g. bipolar junction transistors (BJTs)).

Figure 2:
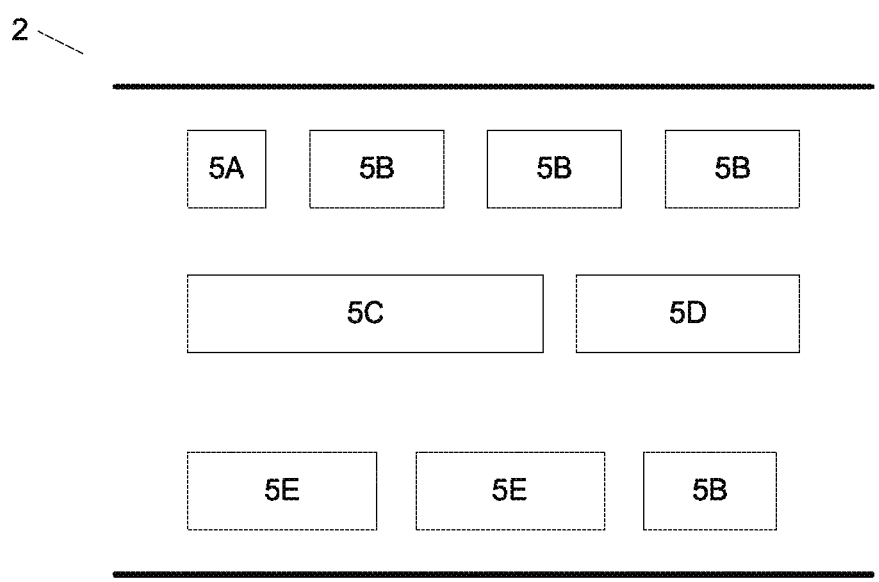
FIG. 2 is a diagram of a portion of an IC which shows various circuits included in the IC.

FIG. 2 is a diagram of a portion of an integrated circuit (IC) 2 which shows various circuits included in the IC 2. Circuits with the same reference number represent different instances of the same circuit design. In this example, nine circuits are illustrated, but there are five unique circuit designs. The circuits 5A, 5C and 5D have a single instance, whereas there are four instances of the circuit 5B and two instances of the circuit 5E. It is noted that in various embodiments there may be any number of different circuits and circuit designs in the IC, and each unique circuit design may be instantiated any number of times. For example, in some embodiments the IC may include a circuit design that has hundreds or thousands of instances in the IC.

Figure 3:
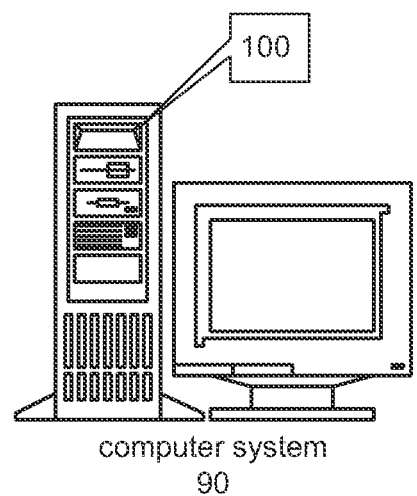
FIG. 3 illustrates an example of a computer system configured to execute a reliability analysis software tool that aids a circuit designer in determining a reliability rating of the IC.

FIG. 3 illustrates an example of a computer system 90 which is configured to execute a reliability analysis software tool 100 which aids the designer in determining the reliability rating of the IC according to the techniques described herein. As described in detail below, the software tool 100 may take into account the fact that one or more of the circuit designs used in the IC have multiple instances. In various embodiments the reliability analysis software tool 100 may execute on any kind of computer system 90, such as a personal computer system (PC), workstation, network appliance, distributed computer system, handheld device, or other computing device or combinations of devices. In general, the term "computer system" can be broadly defined to encompass any device (or combination of devices) having at least one processor that executes instructions from one or more storage mediums.

Figure 4:
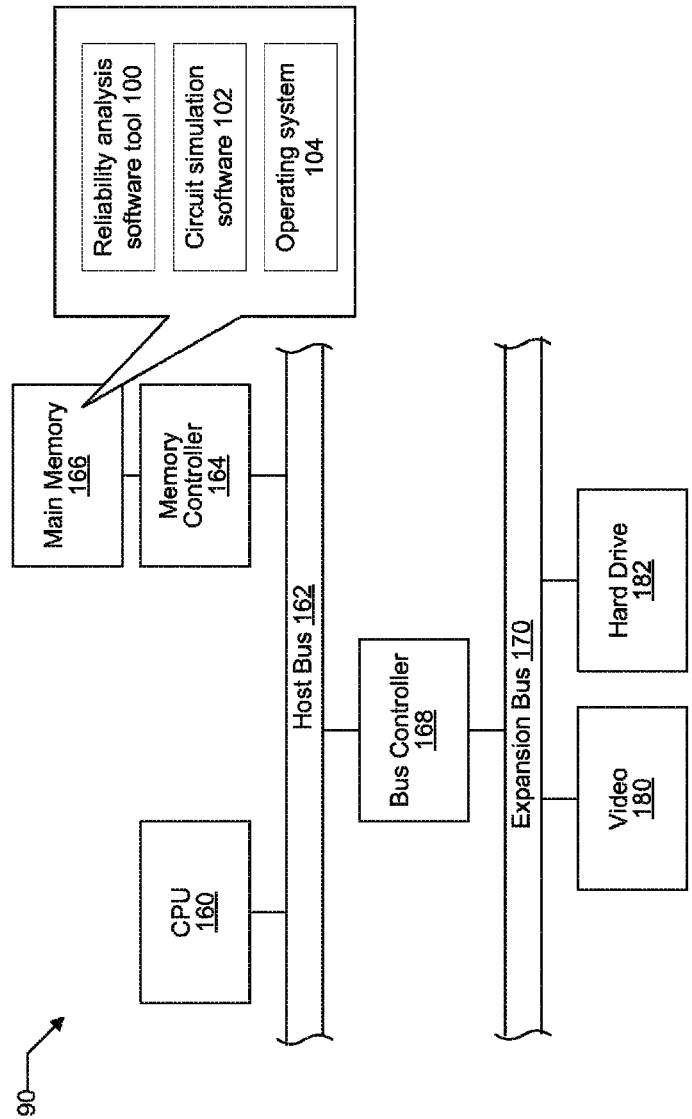
FIG. 4 is a more detailed illustration of the computer system according to one embodiment.

FIG. 4 is a more detailed illustration of the computer system 90 according to one embodiment. It is noted that in other embodiments the computer system 90 may have any other configuration or architecture, and FIG. 4 illustrates a representative PC embodiment. It is also noted that the computer system 90 may be a general purpose desktop computer system, a computer implemented on a card installed in a chassis, or other types of embodiments. Elements of a computer not necessary to understand the present description have been omitted for simplicity.

The computer system 90 may include at least one central processing unit or CPU (processor) 160 which is coupled to a processor or host bus 162. The CPU 160 may be any of various types. For example, in some embodiments, the processor 160 may be compatible with the x86 architecture, while in other embodiments the processor 160 may be compatible with the SPARC™ family of processors. Also, in some embodiments the computer system 90 may include multiple processors 160.

The computer system 90 may also include memory 166 in which program instructions implementing the reliability analysis software tool 100 are stored. In some embodiments the memory 166 may include one or more forms of random access memory (RAM) such as dynamic RAM (DRAM) or synchronous DRAM (SDRAM). In other embodiments, the memory 166 may include any other type of memory configured to store program instructions.

The reliability analysis software tool 100 may execute to compute a reliability rating for an IC under analysis and for circuit designs used in the IC, as described in detail below. In computing the reliability ratings, the reliability analysis software tool 100 may use the simulation results of circuit simulation software 102 which executes to simulate the operation of the circuits used in the IC. In some embodiments the circuit simulation software 102 and the reliability analysis software tool 100 may execute on the same computer system as shown in this example, or in other embodiments they may execute on different computer systems. In some embodiments available prior art software packages such as SPICE (Simulation Program with Integrated Circuit Emphasis) may be used as the circuit simulation software 102. The memory 166 may also store operating system software 104 as well as other software used to control the operation of the computer system 90.

Referring again to FIG. 4, the host bus 162 may be coupled to an expansion or input/output bus 170 by means of a bus controller 168 or bus bridge logic. The expansion bus 170 may be the PCI (Peripheral Component Interconnect) expansion bus, although other bus types can be used. Various devices may be coupled to the expansion or input/output bus 170, such as a hard disk drive 182 which stores information in a non-volatile manner, as well as a video display subsystem 180 which sends video signals to a display device.

Figure 5:
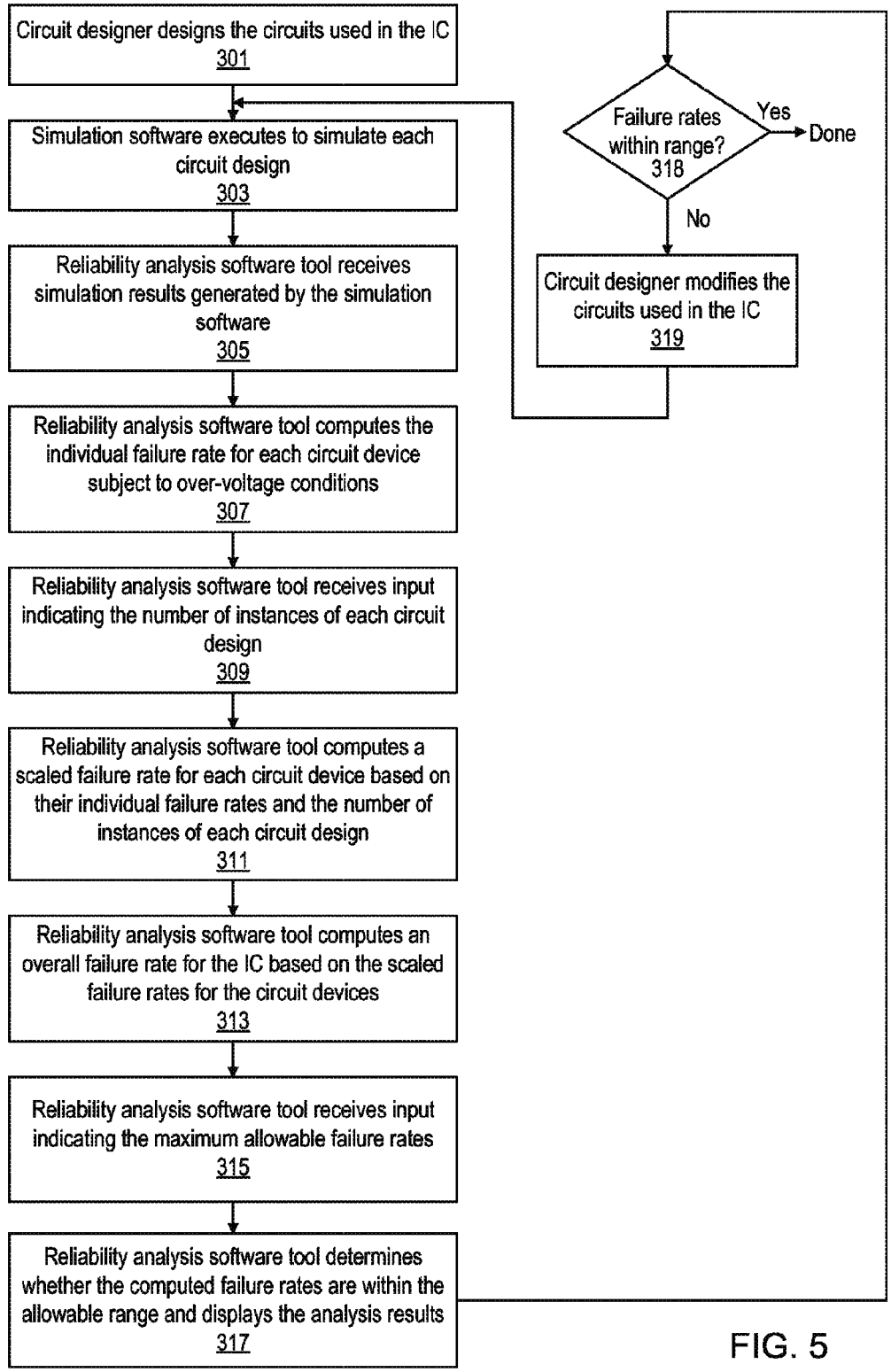
FIG. 5 is a flowchart diagram illustrating one embodiment of a method for analyzing the expected reliability of the IC.

FIG. 5 is a flowchart diagram illustrating one embodiment of a method for analyzing the expected reliability of an integrated circuit. As indicated in block 301, a human circuit designer may first design the circuits that are used in the IC, e.g., using conventionally available circuit design tools known in the art. The circuit designs may be stored in one or more files according to a format or representation which is usable by the circuit simulation software 102 to simulate the operation of the circuits. For example, in SPICE-like simulators, the transistors of a circuit may be listed in a "Spice deck", which is a file that describes the electrical elements in the circuit and the nodes to which the elements are connected. The nodes may be represented in the Spice deck by numbers, with node 0 representing ground and other nodes having non-zero numbers. Each electrical element may be identified by element type, may be given an element name, may optionally be given one or more element values, and may be listed in the Spice deck along with a list of two more nodes to which the device is connected. Transistors may be elements in the Spice deck. While Spice-like simulators are used as an example (including various "fast-Spice" simulators), other embodiments may implement any transistor-level simulator. Additionally, a netlist description of the circuit may be provided as a part of the circuit design process. A netlist may include a list of devices (e.g. transistors), which may in some cases include parameters. The netlist may further include a list of net names (which may describe nodes in the circuit, or arbitrary amounts and shapes of interconnect between terminals of the devices in the netlist). Accordingly, applying the net names to the terminals of the devices describes the interconnect between the devices.

As indicated in block 303, the circuit simulation software 102 may be executed to simulate the operation of each circuit design. In some embodiments, each circuit design may be simulated separately from the other circuit designs. Circuit simulation is typically a computationally intensive and complex process, and simulating the circuits separately may reduce the amount of time required to properly set up and perform the simulation. In some embodiments the various circuit designs may still be simulated at the same time as each other by performing the individual simulations simultaneously on different computer systems, e.g., instead of serially performing each simulation on the same computer system. This may reduce the amount of time required to perform the circuit simulations.

In some embodiments the circuit simulation software 102 may receive input specifying the operation conditions (or stimulus) to be simulated, such as the voltage levels of input signals provided to the circuit as function of time, etc. The simulation may be performed based on the provided input. Generally, the input stimulus provided for the simulation may be the worst case stress expected to be experienced by the circuit during operation of the product that includes the circuit.

As indicated in block 305, the reliability analysis software tool may execute (e.g., on the computer system 90) to receive the simulation results generated by the circuit simulation software 102. For example, in some embodiments the circuit simulation software 102 may store the simulation results for each circuit design in one or more files or databases, and the reliability analysis software tool 100 may receive the files or read the databases produced by the circuit simulation software 102. In other embodiments the circuit simulation software 102 may directly pass the simulation results to the reliability analysis software tool 100 in various ways, such as through programmatic communication, network messaging, or other communication techniques.

In various embodiments the simulation results received by the reliability analysis software tool 100 may indicate any of various factors or conditions which affect the expected reliability or failure rates of the individual transistors or other devices used in the respective circuit designs. In particular, the simulation results may indicate the maximum voltages experienced across the circuit devices during the simulation, e.g., across the connections between the source, gate, and drain terminals of the transistor devices in the circuit. In addition to the maximum voltages, the simulation results may also indicate other factors that affect the expected reliability of the devices in the circuits, such as the time duration for which the maximum voltages were experienced, the average voltage experienced across the devices during the total operation of the circuit, the temperature of the devices, etc.

In some embodiments the reliability analysis software tool 100 may receive or access information indicating the maximum voltage rating for each of the devices in the circuits. The reliability analysis software tool 100 may be configured to analyze the simulation results to determine which of the devices experienced voltages exceeding their maximum voltage ratings during the simulated operation of the respective circuit. For each circuit device that was subjected to over-voltage conditions, the reliability analysis software tool 100 may compute an individual failure rate or other measure of the expected reliability of that device, as indicated in block 307. In some embodiments, devices which were not subject to over-voltage conditions may be presumed to be reliable, and thus no measure of reliability is computed for these devices. In other embodiments, the reliability analysis software tool 100 may use the simulation results to compute a measure of reliability for all of the individual devices in the circuit, regardless of whether or not their maximum voltages were exceeded.

In some embodiments the individual reliability rating for a given device may be expressed as a failure rate, e.g., as a failures-in-time (FIT) rate. The FIT rate of a device is the number of failures that can be expected in one billion device-hours of operation. In other embodiments, the reliability rating may not be expressed as a failure rate per se, but may be expressed as any other quantitative measure that provides an indication of how reliable the device is predicted to be during the operation of the circuit.

The failure rate for a given device in a circuit may be computed by the reliability analysis software tool 100 using an equation or algorithm that is specific to that particular type of device. Thus, different equations or algorithms may be used for different types of devices. In some embodiments the equation or algorithm for a given device type may be provided by the foundry that manufactures the device. Generally, a foundry may be a business or other entity that owns semiconductor manufacturing equipment and manufactures circuits on the equipment. The failure rate equation or algorithm may vary for different types of devices based on the physical properties of the devices, such as their size, composition, etc. The failure rate may also depend on the geometric area of the device (e.g., the area taken by the device on the circuit).

The failure rate computed in block 307 for each of the circuit devices that experienced over-voltage conditions during the simulation is referred to herein as the "individual failure rate" for that device. The individual failure rate refers to the expected failure rate for a single instance of that device in a single instance of the respective circuit design. However, the individual device failure rate may not provide a good indication of how that device impacts the overall failure rate of the IC because there may be multiple instances of the respective circuit design in the IC, and any one of the devices in any of these circuit instances could fail during the operation of the IC. Thus, the reliability analysis software tool 100 may scale the individual failure rate for each device by the number of instances of the device in the IC, i.e., by the number of instances of the circuit design in which the device is used. For failures caused by gate oxide breakdown this effectively represents scaling the failure rate of a single instance of a device to reflect the total chip area used by all of the instances on the device throughout the IC.

As indicated in block 309, the reliability analysis software tool 100 may receive input indicating the number of instances of each circuit design used in the IC. In some embodiments this input may be received as direct interactive user input to the reliability analysis software tool 100, e.g., via a graphical user interface displayed by the reliability analysis software tool 100. In other embodiments the input may be received in other ways, e.g., via a configuration file set up by the circuit designer prior to running the reliability analysis software tool 100.

As indicated in block 311, the reliability analysis software tool 100 may compute a scaled failure rate for each of the circuit devices for which an individual failure rate was computed in block 307. The scaled failure rate for a given device represents the total expected failure rate for all of the instances of the device in the IC (i.e., the total expected failure rate for that particular device over all of the instances of the circuit design in which the device is used). The scaled failure rate is based on the device's individual failure rate and the number of instances of the circuit design in which the device is used. In some embodiments the scaled failure rate is computed by multiplying the individual failure rate by the number of instances of the circuit design. In an embodiment where the individual failure rate is expressed as a FIT rate, the scaled failure rate may be expressed as a scaled FIT rate.

As indicated in block 313, the reliability analysis software tool 100 may compute an overall failure rate for the IC based on the scaled failure rates for the circuit devices computed in block 311. The overall failure rate for the IC is a "product-level" failure rate that represents the total expected failure rate for any of the instances of any of the circuit designs used in the IC. In some embodiments the overall failure rate for the IC may be computed by adding together the scaled failure rates for the circuit devices computed in block 311. In an embodiment where the scaled failure rates are expressed as scaled FIT rates, the overall failure rate for the IC may be expressed as an overall FIT rate for the IC.

One purpose of the reliability analysis software tool 100 may be to aid the circuit designer in determining whether the IC and the circuits used within the IC meet the desired reliability requirements specified by a business or organization producing the IC. As indicated in block 315, the reliability analysis software tool 100 may receive input indicating one or more maximum allowable failure rates associated with the IC. For example, the input may specify a maximum allowable overall failure rate for the IC. In some embodiments the input may also specify a maximum allowable scaled failure rate and/or a maximum allowable individual failure rate for one or more of the circuit designs used in the IC. In some embodiments each circuit design may be assigned its own respective maximum allowable scaled failure rate or maximum allowable individual failure rate. For example, if one of the circuit designs is particularly important for the operation of the IC, the designer may specify a low maximum allowable scaled failure rate for this particular circuit design, whereas other circuit designs may have higher maximum allowable scaled failure rates. In other embodiments, a single maximum allowable scaled failure rate and/or maximum allowable individual failure rate that applies to all of the circuit designs may be specified. In yet other embodiments, there may not be a specified maximum allowable scaled failure rate or maximum allowable individual failure rate for any of the circuit designs, e.g., if the designer is only concerned with the overall failure rate for the IC. The input specifying the maximum allowable failure rate(s) may be received by the reliability analysis software tool 100 in various ways, e.g., as direct interactive user input via a graphical user interface, or via a configuration file set up by the circuit designer prior to running the reliability analysis software tool 100.

As indicated in block 317, the reliability analysis software tool 100 may analyze the failure rates previously computed based on the simulation results to determine whether they are within the allowable range indicated by the maximum allowable failure rate(s) specified in block 315, and may display the results of the analysis. In particular, the reliability analysis software tool 100 may determine whether the overall failure rate for the IC computed in block 313 is greater than the maximum allowable overall failure rate for the IC. If so then the reliability analysis software tool 100 may display information highlighting this problem to bring it to the designer's attention. If maximum allowable scaled or individual failure rates for any of the circuit designs were specified then the reliability analysis software tool 100 may determine whether the individual or scaled failure rates for any of the devices used in the respective circuit designs exceeded the specified maximums. If so then the reliability analysis software tool 100 may display information to call this to the designer's attention.

Figure 6:
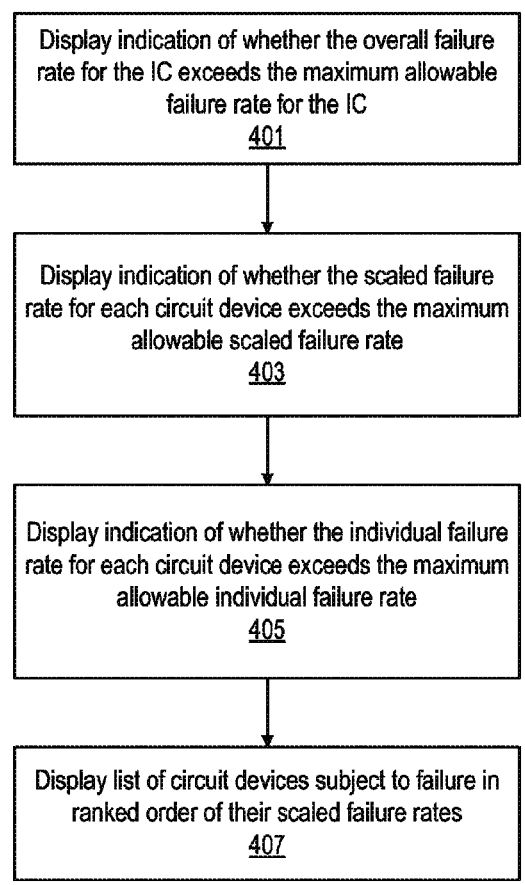
FIG. 6 is a flowchart diagram illustrating information that may be displayed to indicate the results of analyzing the expected reliability of the IC.

In various embodiments the reliability analysis software tool 100 may display various types of information to aid the designer in determining whether the IC meets the reliability requirements or to show the designer which of the circuit devices have the most impact on the overall reliability of the IC. FIG. 6 is a flowchart diagram illustrating information that may be displayed in block 317 according to one embodiment. As indicated in block 401, the reliability analysis software tool 100 may display an indication of whether the overall failure rate for the IC exceeds the maximum allowable failure rate for the IC. For example, the reliability analysis software tool 100 may display the overall failure rate for the IC and the maximum allowable failure rate for the IC, as well as possibly text stating whether or not there is a problem with the overall failure rate for the IC. If the overall failure rate is greater, the reliability analysis software tool 100 may use colors, large text, or other display or audio techniques to draw this fact to the designer's attention to alert the designer that the IC does not meet the reliability specifications.

If maximum allowable scaled failure rates were specified for any of the circuit designs then the reliability analysis software tool 100 may display an indication of whether the scaled failure rates for the respective circuit devices exceed the maximum allowable scaled failure rates for the respective circuit designs in which the devices are used. For example, in some embodiments the reliability analysis software tool 100 may display the scaled failure rate for each circuit device that has a non-zero failure rate, and display the maximum allowable scaled failure rate for the circuit design in which the device is used, as well as possibly text stating whether or not there is a problem with the scaled failure rate for the device. If the scaled failure rate is greater, the reliability analysis software tool 100 may use display or audio techniques to draw this fact to the designer's attention to alert the designer that the device does not meet the reliability requirements.

Similarly, the reliability analysis software tool 100 may display an indication of whether the individual failure rates for the respective circuit devices exceed the maximum allowable individual failure rates for the respective circuit designs in which the devices are used (if maximum allowable individual failure rates were specified for any of the circuit designs), as indicated in block 405.

As discussed above, the individual failure rate for a given circuit device refers to the expected failure rate for one instance of that device in one instance of the respective circuit design in which the device is used, whereas the scaled failure rate for the device represents the total expected failure rate for all of the instances of the device over all of the instances of the respective circuit design used in the IC. Thus, the scaled failure rate for a given circuit device may provide a better indication of how that device impacts the overall failure rate of the IC than does its individual failure rate. For example, a first device used in a first circuit design may have a low individual failure rate compared to the individual failure rate of a second device in a second circuit design. Suppose however that only a single instance of the second circuit design is used in the IC, whereas many instances of the first circuit design are used. This may mean that the scaled failure rate of the first device is higher than the scaled failure rate of the second device (which is the same as the individual failure rate of the second device since there is only one instance of the second circuit design). This indicates that the total expected failure rate for all of the instances of the first device throughout the IC is higher than the expected failure rate of the second device.

As indicated in block 407, the reliability analysis software tool 100 may display a list of circuit devices subject to failure (e.g., those with non-zero failure rates) in ranked order of their scaled failure rates, e.g., by displaying the circuit device with the highest scaled failure rate first, followed by the device with the second highest failure rate second, etc. This may help the circuit designer to prioritize which of the circuit devices to focus on in making circuit modifications in order to bring the overall failure rate of the IC to within the desire specifications. For example, the developer may decide to modify the circuit design that contains the device with the highest scaled failure rate in order to reduce or eliminate the failure rate of this device since this device currently has the single greatest negative impact on the overall failure rate of the IC.

The information displayed by the reliability analysis software tool 100 in FIG. 6 may be displayed in a graphical user interface on a display device coupled to the computer system 90. The information may be displayed or formatted in the graphical user interface in any of various ways, e.g., in one or more windows of the graphical user interface. In some embodiments the graphical user interface may provide features enabling the circuit designer to specify which information to view. For example, the designer may be able to expand or collapse the list of ranked circuit devices, show or hide their individual failure rates, etc. Alternatively, output files may be generated which may be read by the designer to identify circuits which should be redesigned or modified.

Referring again to the flowchart of FIG. 5, as indicated in block 318, the circuit designer may decide whether the failure rates resulting from the current circuit designs are within the allowable ranges, e.g., based on the analysis results displayed by the reliability analysis software tool 100. If so then the circuit design process may be done. Otherwise, the designer may modify one or more of the circuit designs as shown in 319. The process may then be repeated as shown by the flowchart arrow returning to block 303, e.g., so that the modified circuit designs can be simulated and analyzed to determine whether they meet the desired reliability specifications. As discussed above, displaying the scaled failure rates of the devices may help the designer decide which circuit designs to modify in order to most reduce the overall failure rate of the IC. In some embodiments the reliability analysis software tool 100 may aid the designer in choosing which circuit designs or devices to modify. For example, the reliability analysis software tool 100 may provide an indication of one or more sets of devices that would result in the overall failure rate of the IC being reduced to within the range of tolerance if the failure rate(s) of the indicated device(s) in the set were eliminated. Thus, the designer may choose to modify the devices in one of the sets indicated by the reliability analysis software tool 100.

In some embodiments the reliability analysis software tool 100 may also store the reliability analysis results in one or more files or databases, e.g., to save a log of the reliability analysis for future reference. For example, the reliability analysis results may be stored in one or more files or databases on the hard drive 182 of the computer system 90.

It is noted that the flowchart of FIG. 5 illustrates the operation of the reliability analysis software tool 100 according to some particular embodiments, and numerous alternative embodiments are contemplated. For example, although the flowchart is illustrated and discussed in terms of failure rates, in other embodiments other types of reliability ratings of the circuit devices and IC may be used. It is also noted that the reliability analysis software tool 100 may be implemented in any of various ways, e.g., as a single program or as a plurality of programs that operate in conjunction with each other. It is further noted that, while a reliability analysis software tool 100 is described as performing various operations described above, in other cases the operations may be performed manually by the designer using various computer tools such as the circuit simulator, etc.

Figure 7:
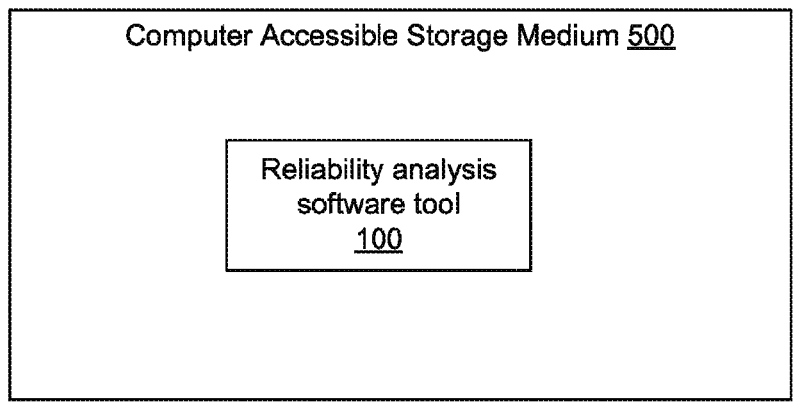
FIG. 7 is a block diagram of a computer accessible storage medium that stores program instructions implementing the reliability analysis software tool.

Turning now to FIG. 7, a block diagram of a computer accessible storage medium 500 is shown. The computer accessible storage medium 500 may store program instructions implementing the reliability analysis software tool 100. The instructions may be executable by one or more processors to perform the functions of the reliability analysis software tool 100 described above. Generally, the computer accessible storage medium 500 may store any set of instructions which, when executed, implement a portion or all of the functions described herein of the reliability analysis software tool 100.

Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. A method comprising:
    receiving results of simulating one or more circuit designs used in an integrated circuit (IC), the results generated by a circuit simulator executed on a computer system, the circuit simulator operating on one or more files stored on the computer system and representing the one or more circuit designs, and the circuit simulator further operating on input stimulus provided to the circuit simulator to apply to the one or more circuit designs as represented in the one or more files;
    using the simulation results to compute a respective individual failure rate for one or more circuit devices used in the one or more circuit designs, wherein the individual failure rate for a given circuit device indicates an expected failure rate for a single instance of the given circuit device in a single instance of the respective circuit design in which the given circuit device is used;
    for each respective circuit device of the one or more circuit devices, computing a scaled failure rate for the respective circuit device based on the individual failure rate for the respective circuit device and a number of instances of the circuit design in which the respective circuit device is used; and
    predicting a failure rate of the IC based on the scaled failure rates of the one or more circuit devices.

2. The method of claim 1,
    wherein the one or more circuit devices are selected in response to determining that the simulation results indicate that a voltage on each of the one or more circuit devices exceeded a maximum allowable voltage during the simulation.

3. The method of claim 1, further comprising:
    using the scaled failure rates of the one or more circuit devices to compute an overall failure rate for the IC.

4. The method of claim 3,
    wherein the overall failure rate for the IC is computed by adding together the scaled failure rates of the one or more circuit devices.

5. The method of claim 3, further comprising:
    receiving a maximum allowable failure rate for the IC;
    wherein the indication of reliability of the IC indicates whether the overall failure rate for the IC is greater than the maximum allowable failure rate for the IC.

6. The method of claim 1,
    wherein the scaled failure rate for each respective circuit device is computed by multiplying the individual failure rate for the respective circuit device by the number of instances of the circuit design in which the respective circuit device is used.

7. The method of claim 1, further comprising:
    displaying the scaled failure rates for at least a subset of the one or more circuit devices.

8. The method of claim 7,
    wherein the scaled failure rates are displayed in a ranked order that indicates which circuit device has the highest scaled failure rate.

9. The method of claim 1,
    wherein the respective individual failure rate for each of the one or more circuit devices is a respective failures-in-time (FIT) rate;
    wherein the respective scaled failure rate for each of the one or more circuit devices is a respective scaled FIT rate.

10. A computer accessible storage medium storing program instructions executable by one or more processors to:
    receive results of simulating one or more circuit designs used in an integrated circuit (IC), the results generated by a circuit simulator executed on a computer system, the circuit simulator operating on one or more files stored on the computer system and representing the one or more circuit designs, and the circuit simulator further operating on input stimulus provided to the circuit simulator to apply to the one or more circuit designs as represented in the one or more files;
    use the simulation results to compute a respective individual failure rate for one or more circuit devices used in the one or more circuit designs, wherein the individual failure rate for a given circuit device indicates an expected failure rate for a single instance of the given circuit device in a single instance of the respective circuit design in which the given circuit device is used;
    for each respective circuit device of the one or more circuit devices, compute a scaled failure rate for the respective circuit device based on the individual failure rate for the respective circuit device and a number of instances of the circuit design in which the respective circuit device is used; and
    predict a failure rate of the IC based on the scaled failure rates of the one or more circuit devices.

11. The computer accessible storage medium of claim 9 wherein the program instructions are further executable to:
    use the scaled failure rates of the one or more circuit devices to compute an overall failure rate for the IC.

12. The computer accessible storage medium of claim 11,
    wherein the overall failure rate for the IC is computed by adding together the scaled failure rates of the one or more circuit devices.

13. The computer accessible storage medium of claim 11, wherein the program instructions are further executable to:
    receive a maximum allowable failure rate for the IC;
    wherein the indication of reliability of the IC indicates whether the overall failure rate for the IC is greater than the maximum allowable failure rate for the IC.

14. The computer accessible storage medium of claim 11, wherein the scaled failure rate for each respective circuit device is computed by multiplying the individual failure rate for the respective circuit device by the number of instances of the circuit design in which the respective circuit device is used.

15. The computer accessible storage medium of claim 10, wherein the program instructions are further executable to:
display the scaled failure rates for at least a subset of the one or more circuit devices.

16. The computer accessible storage medium of claim 15, wherein the scaled failure rates are displayed in a ranked order that indicates which circuit device has the highest scaled failure rate.

17. The computer accessible storage medium of claim 10, wherein the respective individual failure rate for each of the one or more circuit devices is a respective failures-in-time (FIT) rate;
wherein the respective scaled failure rate for each of the one or more circuit devices is a respective scaled FIT rate.

18. A computer accessible storage medium storing program instructions executable by one or more processors to:
receive results of simulating one or more circuit designs used in an integrated circuit (IC);
use the simulation results to compute a respective individual failure rate for one or more circuit devices used in the one or more circuit designs, wherein the individual failure rate for a given circuit device indicates an expected failure rate for a single instance of the given circuit device in a single instance of the respective circuit design in which the given circuit device is used;
for each respective circuit device of the one or more circuit devices, compute a scaled failure rate for the respective circuit device based on the individual failure rate for the respective circuit device and a number of instances of the circuit design in which the respective circuit device is used; and
predict a failure rate of the IC based on the scaled failure rates of the one or more circuit devices;
wherein the one or more circuit devices are selected in response to determining that the simulation results indicate that a voltage on each of the one or more circuit devices exceeded a maximum allowable voltage during the simulation.

19. The computer accessible storage medium of claim 18, wherein the respective individual failure rate for each of the one or more circuit devices is a respective failures-in-time (FIT) rate;
wherein the respective scaled failure rate for each of the one or more circuit devices is a respective scaled FIT rate.

20. The computer accessible storage medium of claim 18 wherein the program instructions are further executable to:
use the scaled failure rates of the one or more circuit devices to compute an overall failure rate for the IC.

* * * * *